United States Patent
Maeda et al.

(10) Patent No.: US 12,163,215 B2
(45) Date of Patent: Dec. 10, 2024

(54) FILM FORMING APPARATUS AND FILM FORMING METHOD

(71) Applicant: TOKYO ELECTRON LIMITED, Tokyo (JP)

(72) Inventors: Koji Maeda, Nirasaki (JP); Atsushi Shimada, Nirasaki (JP); Katsushi Oikawa, Nirasaki (JP); Tetsuya Miyashita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 290 days.

(21) Appl. No.: 17/631,188

(22) PCT Filed: Jul. 2, 2020

(86) PCT No.: PCT/JP2020/026077
§ 371 (c)(1),
(2) Date: Jan. 28, 2022

(87) PCT Pub. No.: WO2021/024660
PCT Pub. Date: Feb. 11, 2021

(65) Prior Publication Data
US 2022/0178014 A1    Jun. 9, 2022

(30) Foreign Application Priority Data

Aug. 8, 2019 (JP) ................................ 2019-146662
Feb. 3, 2020 (JP) ................................ 2020-016383

(51) Int. Cl.
*C23C 14/34* (2006.01)
*C23C 14/35* (2006.01)
(Continued)

(52) U.S. Cl.
CPC ........ *C23C 14/352* (2013.01); *C23C 14/3407* (2013.01); *C23C 14/52* (2013.01);
(Continued)

(58) Field of Classification Search
CPC ... C23C 14/352; C23C 14/3407; C23C 14/52; C23C 14/54; C23C 14/35; C23C 14/14;
(Continued)

(56) References Cited

U.S. PATENT DOCUMENTS 5,833,815 A    11/1998    Kim et al.
2009/0229970 A1    9/2009    Itagaki et al.

FOREIGN PATENT DOCUMENTS

CN    110055500 A    7/2019
JP    H11-43766 A    2/1999
(Continued)

*Primary Examiner* — Rodney G McDonald
(74) *Attorney, Agent, or Firm* — Nath, Goldberg & Meyer; Jerald L. Meyer; Tanya E. Harkins

(57) ABSTRACT

A film forming apparatus includes a processing container, a substrate holder configured to hold a substrate inside the processing container, a cathode unit disposed above the substrate holder, and a gas introducing mechanism configured to introduce a plasma generating gas into the processing container. The cathode unit includes a target, a power supply configured to supply electric power to the target, a magnet provided on a rear side of the target, and a magnet driving part configured to drive the magnet. The magnet driving part includes an oscillation driver configured to oscillate the magnet along the target, and a perpendicular driver configured to drive the magnet in a direction perpendicular to a main surface of the target independently of driving performed by the oscillation driver. Sputtered particles are deposited on the substrate by magnetron sputtering.

19 Claims, 15 Drawing Sheets

(51) Int. Cl.
  *C23C 14/52* (2006.01)
  *C23C 14/54* (2006.01)
  *H01J 37/34* (2006.01)

(52) U.S. Cl.
  CPC .......... *C23C 14/54* (2013.01); *H01J 37/3405* (2013.01); *H01J 37/3417* (2013.01); *H01J 37/3423* (2013.01); *H01J 37/3426* (2013.01); *H01J 37/3452* (2013.01); *H01J 37/3455* (2013.01); *H01J 37/3482* (2013.01)

(58) Field of Classification Search
  CPC ............... H01J 37/3405; H01J 37/3417; H01J 37/3423; H01J 37/3426; H01J 37/3452; H01J 37/3455; H01J 37/3482; H01J 37/3429
  USPC ........................... 204/298.2, 192.13, 298.03
  See application file for complete search history.

(56) References Cited

FOREIGN PATENT DOCUMENTS

| | | |
|---|---|---|
| JP | H11-311432 A | 11/1999 |
| JP | 2008-57011 A | 3/2008 |
| JP | 2010-31353 A | 2/2010 |
| JP | 2011-137205 A | 7/2011 |
| JP | 2013-199668 A | 10/2013 |
| JP | 2015-86438 A | 5/2015 |

Continuous oscillation + fixing in Z direction

Continuous oscillation + moving in Z direction 3-dimensional scanning (embodiment)

FIG. 12A

Flow rate of Ar gas : 200sccm

| Position of magnet \ Number of substrates | 1 | 2 | 3 | 4 | 5 | 6 | 7 | 8 | 9 | 10 |
|---|---|---|---|---|---|---|---|---|---|---|
| Left end | O | O | O | O | O | O | O | O | O | O |
| Center | O | O | O | O | O | O | O | O | O | O |

FIG. 12B

Flow rate of Ar gas : 11.5sccm

| Position of magnet \ Number of substrates | 1 | 2 | 3 | 4 | 5 | 6 | 7 | 8 | 9 | 10 |
|---|---|---|---|---|---|---|---|---|---|---|
| Left end | R | R | R | R | R | R | R | R | R | R |
| Center | O | O | O | O | O | R | O | R | O | O |

FILM FORMING APPARATUS AND FILM FORMING METHOD

This is a National Phase Application filed under 35 U.S.C. 371 as a national stage of PCT/JP2020/026077, filed Jul. 2, 2020, an application claiming the benefit of Japanese Application No. 2019-146662, filed Aug. 8, 2019 and Japanese Application No. 2020-016383, filed Feb. 3, 2020, the content of each of which is hereby incorporated by reference in its entirety.

TECHNICAL FIELD

The present disclosure relates to a film forming apparatus and a film forming method.

BACKGROUND

As a technique for forming a metal film, sputter film formation in which particles sputtered from a target are deposited on a substrate is used. Patent Document 1 discloses, as a film forming apparatus performing sputtering film formation, a magnetron sputtering apparatus in which a magnet is provided on the rear side of a target, and high-density plasma is formed by an electric field generated by a voltage applied to the target and a magnetic field generated by the magnet to perform sputtering film formation. In Patent Document 1, it is also described that a mechanism for scanning a magnet is provided to control the erosion of the target during the sputtering film formation.

PRIOR ART DOCUMENT

Patent Document

Patent Document 1: Japanese Laid-Open Patent Publication No. 2015-086438

SUMMARY

The present disclosure provides a film forming apparatus and a film forming method capable of effectively controlling the erosion of a target.

A film forming apparatus according to an aspect of the present disclosure includes a processing container, a substrate holder configured to hold a substrate inside the processing container, a cathode unit disposed above the substrate holder, and a gas introducing mechanism configured to introduce a plasma generating gas into the processing container. The cathode unit includes a target configured to emit sputtered particles to the substrate, a power supply configured to supply electric power to the target, a magnet provided on a rear side of the target to apply a leakage magnetic field to the target, and a magnet driving part configured to drive the magnet. The magnet driving part includes an oscillation driver configured to oscillate the magnet along the target, and a perpendicular driver configured to drive the magnet in a direction perpendicular to a main surface of the target independently of driving performed by the oscillation driver. Magnetron plasma is formed near the target, and the sputtered particles are deposited on the substrate by magnetron sputtering.

According to the present disclosure, a film forming apparatus and a film forming method capable of effectively controlling the erosion of a target are provided.

BRIEF DESCRIPTION OF DRAWINGS

FIGS. 12A and 12B are views showing ignition states when the positions of the magnets at the time of plasma ignition were the left end and the center, in which FIG. 12A is a case in which a flow rate of an Ar gas was set to 200 sccm, and FIG. 12B is a case of a low flow rate (low pressure) in which the flow rate of the Ar gas was set to 11.5 sccm.

DETAILED DESCRIPTION

Hereinafter, embodiments will be described in detail with reference to the accompanying drawings.

First Embodiment

Figure 1:
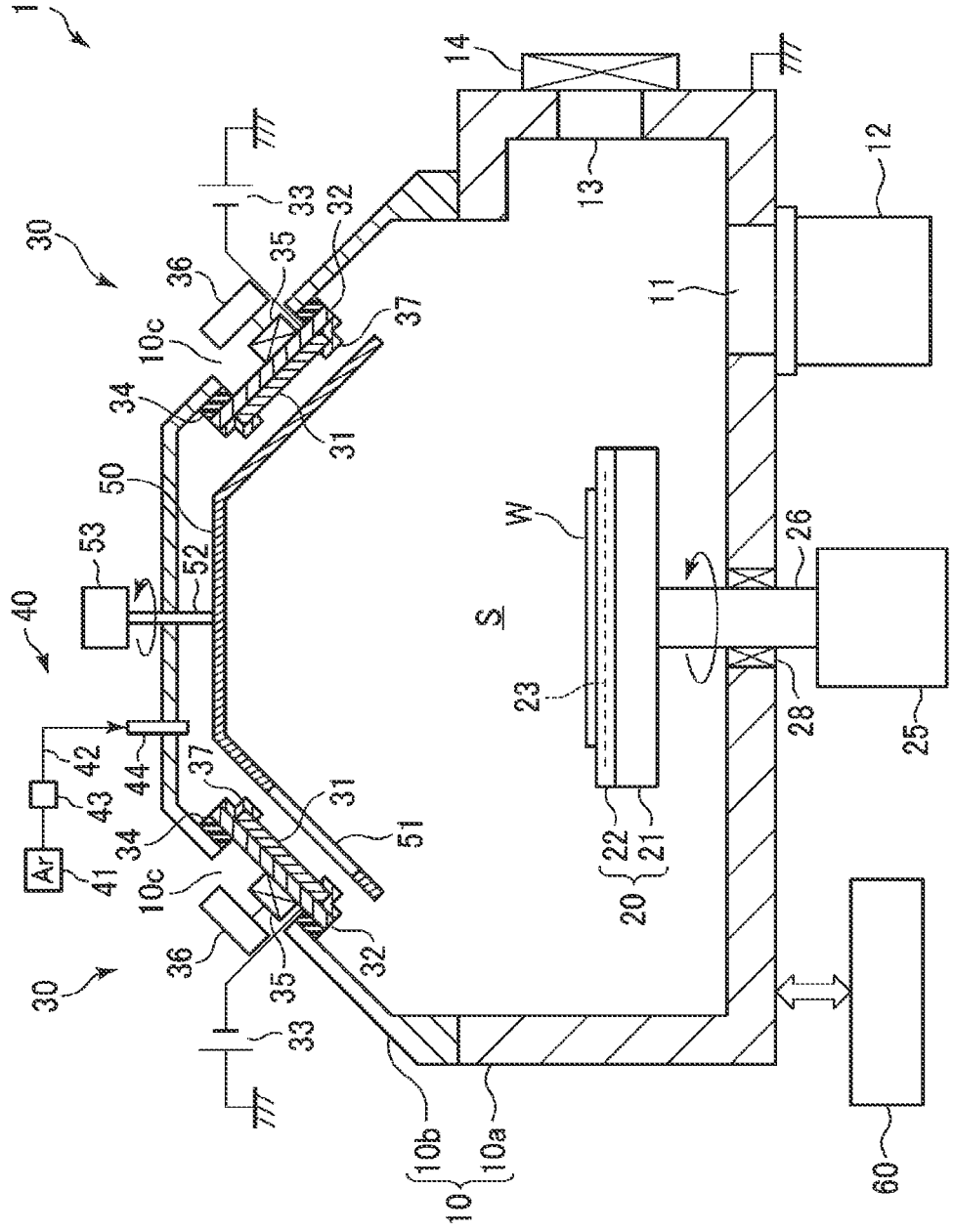
FIG. 1 is a cross-sectional view illustrating a film forming apparatus according to a first embodiment.
Figure 2:
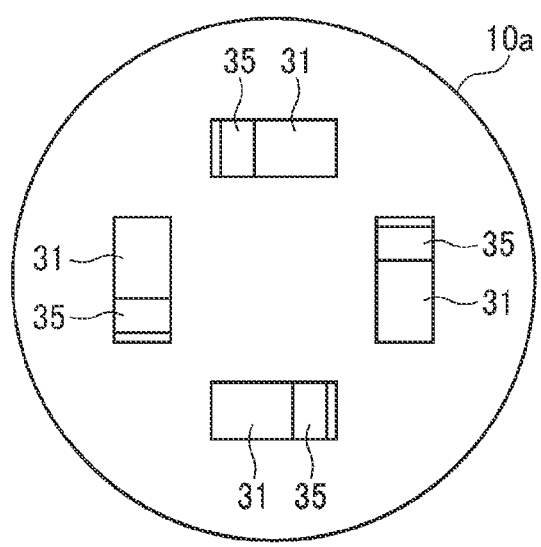
FIG. 2 is a schematic plan view of the film forming apparatus according to the first embodiment.

FIG. 1 is a cross-sectional view illustrating a film forming apparatus according to a first embodiment, and FIG. 2 is a schematic plan view of the same. A film forming apparatus 1 of the present embodiment forms a film of a metal, an alloy, or a compound on a substrate W by sputtering. The substrate W is not particularly limited, and examples thereof may include a semiconductor wafer having a semiconductor substrate such as Si.

The film forming apparatus 1 includes a processing container 10, a substrate holder 20, a cathode unit 30, a gas supplier 40, a shutter 50, and a controller 60.

The processing container 10 is made of, for example, aluminum, and defines a processing chamber in which the substrate W is processed. The processing container 10 is connected to a ground potential. The processing container 10 includes a container main body 10a having an open upper portion and a lid 10b provided to close an upper opening of the container main body 10a. The lid 10b has a substantially truncated conical shape.

An exhaust port 11 is formed in a bottom portion of the processing container 10, and an exhaust device 12 is connected to the exhaust port 11. The exhaust device 12 includes a pressure control valve and a vacuum pump, and the interior of the processing container 10 is evacuated to a predetermined degree of vacuum by the exhaust device 12.

A loading/unloading port 13 is formed in a sidewall of the processing container 10 to perform loading/unloading of the substrate W between the processing container 10 and a transfer chamber (not illustrated) adjacent thereto. The loading/unloading port 13 is opened and closed by a gate valve 14.

The substrate holder 20 has a substantially disk-like shape and is provided near the bottom portion within the processing container 10 to hold the substrate W horizontally. The substrate holder 20 includes a base part 21 and an electrostatic chuck 22. The base part 21 is made of, for example, aluminum. The electrostatic chuck 22 is made of a dielectric material and includes an electrode 23 provided therein. A DC voltage is applied to the electrode 23 from a DC power supply (not illustrated), and the substrate W is electrostatically attracted to a surface of the electrostatic chuck 22 by virtue of an electrostatic force generated by the DC voltage.

A temperature control mechanism (not illustrated) may be provided inside the substrate holder 20. As the temperature control mechanism, for example, a mechanism configured to cause a temperature control medium to flow through the substrate holder 20 or a heater may be used.

The substrate holder 20 is connected to a driving device 25 provided below the processing container 10 via a support shaft 26. The support shaft 26 extends from the driving device 25 through the bottom wall of the processing container 10, and a tip end thereof is connected to the center of a bottom surface of the substrate holder 20. The driving device 25 is configured to rotate and move the substrate holder 20 up and down via the support shaft 26. A space between the support shaft 26 and the bottom wall of the processing container 10 is sealed by a sealing member 28. By providing the sealing member 28, the support shaft 26 is rotatable and movable up and down while maintaining the interior of the processing container 10 in a vacuum state. The sealing member 28 may be, for example, a magnetic fluid seal.

The cathode unit 30 is provided on an inclined surface of the lid 10b of the processing container 10. As illustrated in FIG. 2, in the present example, four cathode units 30 are provided at the same height position at equal intervals. The number of cathode units is not limited thereto and may be any number of one or more. The cathode unit 30 includes a target 31, a target electrode 32 configured to hold the target 31, and a power supply 33 configured to supply electric power to the target via the target electrode 32.

The target 31 is made of a metal, an alloy, or a compound constituting a film to be deposited, and has a rectangular planar shape. The material constituting the target 31 may be appropriately selected depending on the film to be formed, and examples thereof may include magnetic materials such as CoFeB and NiFe, a non-magnetic material such as Cu, and the like. The material is not limited to a conductive material and may be an insulating material. The four targets 31 may be made of different materials or may be made of the same material. As will be described later, sputtered particles are emitted by applying a voltage to the target 31. At the time of film formation, a voltage may be applied to one or more targets 31 to emit sputtered particles.

The target electrode 32 is provided inside a hole 10c formed in the inclined surface of the lid 10b of the processing container 10 via an insulating member 34. The power supply 33 is a DC power supply and applies a negative DC voltage to the target electrode 32. The target electrode 32 functions as a cathode. The power supply 33 may be an AC power supply. When the target 31 is an insulating material, the AC power supply is used.

A shield member 37 is provided on an outer circumference of the target 31. The shield member 37 has a function of preventing sputtered particles emitted from the target from going around to the wall portion of the processing container 10 and the rear side of the target such as the target electrode 32. The shield member 37 also has a function of regulating the emission direction of the sputtered particles emitted from the target 31.

A cathode magnet (a magnet) 35 is provided on the rear side (outside) of the target electrode 32. The cathode magnet 35 is provided to apply a leakage magnetic field to the target 31 to perform magnetron sputtering. The cathode magnet 35 is provided outside the processing container 10 and configured to be driven by the magnet driving part 36.

Figure 3:
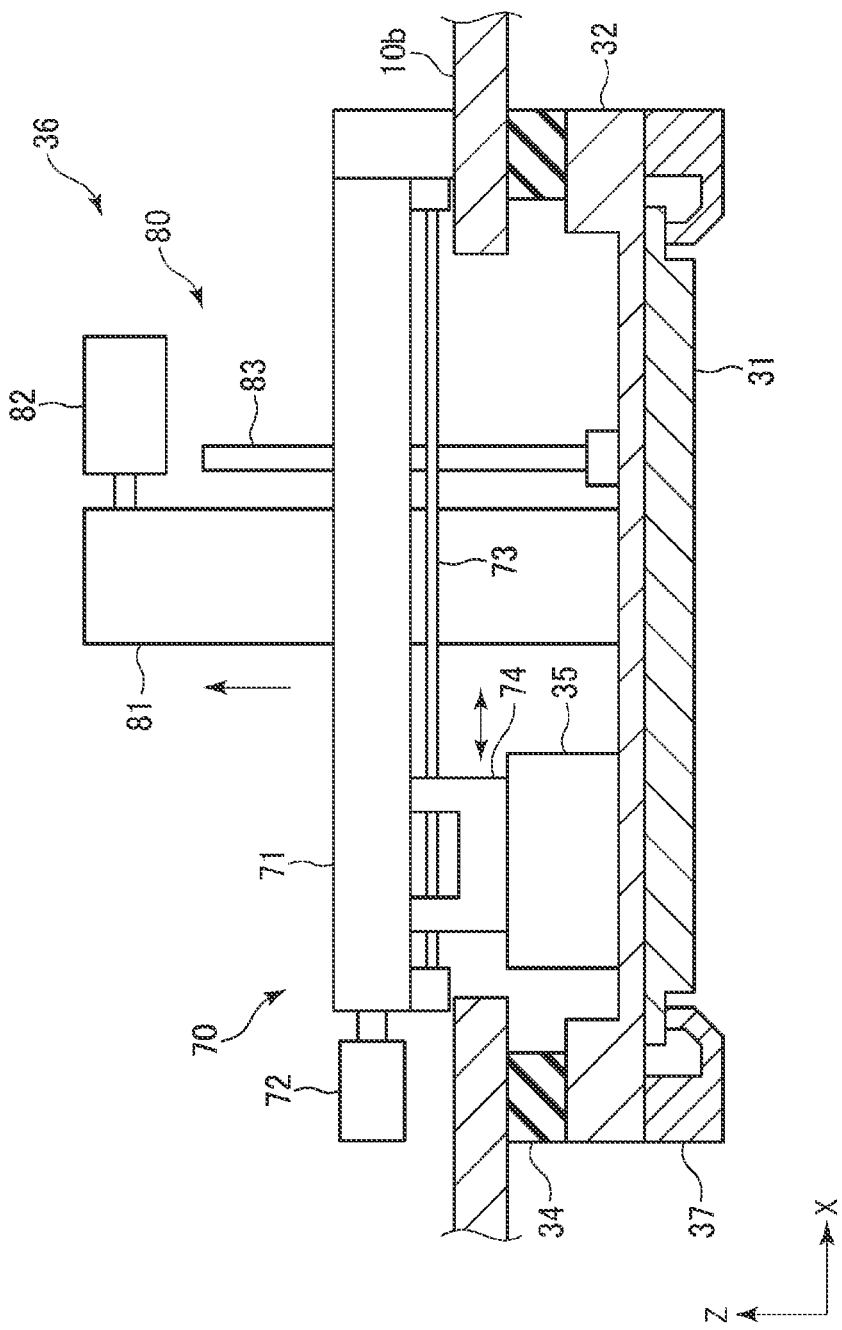
FIG. 3 is a cross-sectional view for explaining in detail a magnet driving part of the film forming apparatus according to the first embodiment.

FIG. 3 is a cross-sectional view for explaining the magnet driving part 36 in detail. As illustrated in FIG. 3, the magnet driving part 36 includes an oscillation driver 70 configured to oscillate the cathode magnet 35 along a long side direction (an X direction) of the target 31, and a perpendicular driver 80 configured to drive the cathode magnet 35 in a direction perpendicular to a main surface of the target 31 (a Z direction). The perpendicular driver 80 drives the cathode magnet 35 in the Z direction independently of the oscillation driver 70. As a result, the cathode magnet 35 is configured to be oscillated in the X direction along the long-side direction of the target 31 and to move, independently of the oscillation in the X direction, in the Z direction which is a direction perpendicular to the main surface of the target 31. That is, the cathode magnet 35 can be scanned three-dimensionally.

In the embodiment, an example in which ball screw mechanisms are used for both the oscillation driver 70 and the perpendicular driver 80 is illustrated. The oscillation driver 70 includes an X-direction ball screw mechanism 71 incorporating therein an X-direction ball screw (not illustrated) extending in the X direction, a motor 72 configured to rotate the X-direction ball screw, and a guide member 73 extending along the X-direction ball screw mechanism 71. The oscillation driver 70 further includes an X-direction moving member 74 threadedly coupled to the X-direction ball screw and guided by the guide member 73 to move in the X direction. The cathode magnet 35 is supported by the X-direction moving member 74. When the X-direction ball screw of the X-direction ball screw mechanism 71 is rotated by the motor 72, the cathode magnet 35 is driven in the X direction along the guide member 73 together with the X-direction moving member 74. The perpendicular driver 80 includes a Z-direction ball screw mechanism 81 incorporating therein a Z-direction ball screw (not illustrated) extending in the Z direction, a motor 82 configured to rotate the Z-direction ball screw, a guide member 83 extending along the Z-direction ball screw mechanism 81, and a Z-direction moving member (not illustrated) threadedly coupled to the Z-direction ball screw. The Z-direction moving member is configured to be guided by the guide member 83. The X-direction ball screw mechanism 71 is supported by the Z-direction moving member. When the Z-direction ball screw of the Z-direction ball screw mechanism 81 is rotated by the motor 82, the X-direction ball screw mechanism 71 is driven in the Z direction along the guide member 83 together with the Z-direction moving member. As a result, the cathode magnet 35 is driven in the Z direction together with the X-direction ball screw mechanism 71.

The driving mechanisms of the oscillation driver 70 and the perpendicular driver 80 are not limited to the above-described ball screw mechanisms. Other driving mechanisms may be used as long as the oscillation driver 70 has a configuration that includes a first moving part extending in the X direction and configured to move the cathode magnet 35 in the X direction, and the perpendicular driver 80 has a configuration that includes a second moving part configured to move the first moving part in the Z direction. In the case of the ball screw mechanism, the X-direction ball screw mechanism 71 constitutes the first moving part, and the Z-direction ball screw mechanism 81 constitutes the second moving part.

Returning back to FIG. 1, the gas supplier 40 includes a gas source 41, a gas supply pipe 42 extending from the gas source 41, a flow rate controller 43 such as a mass flow controller provided in the gas supply pipe 42, and a gas introduction member 44. From the gas source 41, an inert gas such as Ar, Ne, Kr, or the like (FIG. 1 illustrates an example of the Ar gas) is supplied into the processing container 10 through the gas supply pipe 42 and the gas introduction member 44 as a plasma-generating gas excited inside the processing container 10.

The gas supplied into the processing container 10 is excited by applying a voltage from the power supply 33 to the targets 31 via the target electrodes 32. At this time, since the leakage magnetic field of the cathode magnet 35 is applied to the peripheries of the targets 31, magnetron plasma is intensively formed around the targets 31. In this state, positive ions in the plasma collide with the targets 31, the constituent elements of the targets are emitted as sputtered particles from the targets 31, and the sputtered particles are deposited on the substrate W by magnetron sputtering.

The shutter 50 has a function of shielding a target 31 that is not used for film formation. The shutter 50 has a truncated conical shape along the lid 10b of the processing container 10 and has a size that covers projection areas of four targets 31, and openings 51 having a size slightly larger than the targets 31 are formed in the shutter 50. The openings 51 correspond to targets 31 used for film formation, and another target 31 is shielded by the shutter 50. The shutter 50 is installed to be rotatable via a rotation shaft 52 provided in the center of the ceiling of the processing container 10. The rotation shaft 52 is connected to a rotation mechanism 53 provided above the processing container 10, and the shutter 50 is rotated by the rotation mechanism 53.

The controller 60 is configured with a computer, and includes a main controller configured with a CPU that controls each component of the film forming apparatus 1, for example, the power supply 33, the exhaust device 12, the magnet driving part 36, the gas supplier 40, the rotation mechanism 53, or the like. In addition, the controller includes input devices such as a keyboard and a mouse, an output device, a display device, and a storage device. By setting the storage medium in which the processing recipe is stored in the storage device, the main controller of the controller 60 causes the film forming apparatus 1 to execute a predetermined operation based on the processing recipe called from a storage medium. In particular, in the present embodiment, the controller 60 is characterized in the operation control of the magnet driving part 36 that drives the cathode magnet 35.

Figure 4:
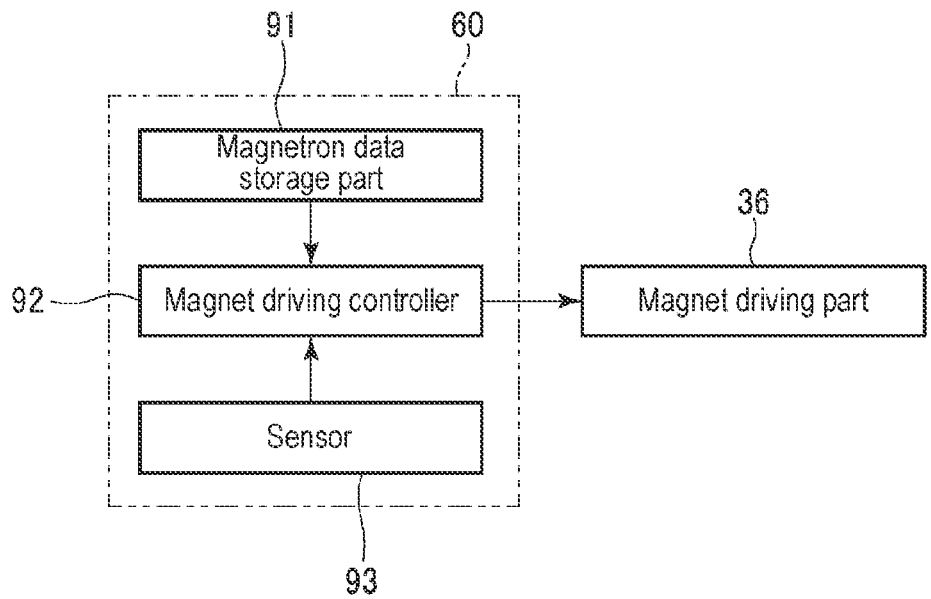
FIG. 4 is a block diagram for explaining a portion of a controller that controls the magnet driving part in the film forming apparatus according to the first embodiment.

Specifically, as illustrated in FIG. 4, the controller 60 includes, for example, a magnet data storage part 91, a magnet driving controller 92, and a sensor 93 configured to detect a discharge parameter such as a discharge voltage. The magnet data storage part 91 stores, for example, the leakage magnetic field strength of the cathode magnet 35 according to a target shape based on the erosion of a target. Then, based on the data stored in advance in the magnet data storage part 91, the magnet driving controller 92 may control the driving of the cathode magnet 35 performed by the magnet driving part 36 (the driving performed by the perpendicular driver 80). In addition, the discharge parameter may be monitored in real time by the sensor 93, and the magnet driving controller 92 may control the driving of the cathode magnet 35 performed by the magnet driving part 36 (the driving performed by the perpendicular driver 80) so that the discharge parameter is maintained in a constant manner.

The magnet driving controller 92 may also control the position of the cathode magnet 35 at the time of plasma ignition by the oscillation driver 70 and the moving direction of the cathode magnet 35 by the oscillation driver 70 after plasma ignition.

Next, the operation of the film forming apparatus configured as described above will be described.

First, the gate valve 14 is opened, and the substrate W is loaded into the processing container 10 from a transfer chamber (not illustrated) adjacent to the processing container 10 by a transfer apparatus (not illustrated), and is held by the substrate holder 20.

Then, the interior of the processing container 10 is evacuated and the interior of the processing container 10 is controlled to a predetermined pressure. Next, a target 31 to be used is shielded and discharged in advance by the shutter 50 to clean the surface of the target. Thereafter, a film forming process is initiated in the state in which a to-be-unused target 31 is shielded by the shutter 50 and the openings 51 are made to correspond to to-be-used targets 31.

The inert gas such as the Ar gas is introduced from the gas supplier 40 into the processing container 10. Subsequently, a voltage is applied to the target 31 from the power supply 33 via the target electrode 32 to excite the Ar gas. At this time, since the leakage magnetic field of the cathode magnet 35 is applied to the periphery of the target, magnetron plasma in the state in which plasma is concentrated around the target 31 is formed. In this state, positive ions in the plasma collide with the target 31, the constituent elements of the target are emitted as sputtered particles from the target 31, and the sputtered particles are deposited on the substrate W by magnetron sputtering.

In such magnetron sputter film formation, the erosion of the target progresses by using the target for a long period of time. As the erosion of the target progresses, the target will eventually reach the end of its life. Since the progress of target erosion is biased due to fluctuation in the leakage magnetic field or the like, conventionally, it has been a problem that the film formation performance (film formation rate or distribution) fluctuates and the ignition performance becomes unstable until the end of life due to the bias of the progress of target erosion. In particular, in an application in which flatness and film quality of a film are required, low-pressure sputtering is performed under an ultra-high vacuum (0.02 Pa or less), but in the low-pressure sputtering, the film formation performance and ignition performance fluctuate significantly. In addition, due to the bias of the progress of target erosion, there is another problem in that the utilization rate of the target is not sufficient, and thus the target life end is shortened. Therefore, there is a need for a technique that reduces the fluctuation of the leakage magnetic field directly above the target and evenly sputters the entire surface of the target without causing steep erosion of the target.

From this point of view, in Patent Document 1, a rectangular target having a large area is used, and the cathode magnet is continuously oscillated along the target.

However, only by oscillating the cathode magnet, steep erosion is formed on the target based on the magnetic circuit of the cathode magnet. For this reason, instability in ignition/discharge and fluctuation in film forming speed occur. Such a tendency is particularly remarkable when the target is a magnetic material.

Figure 5:
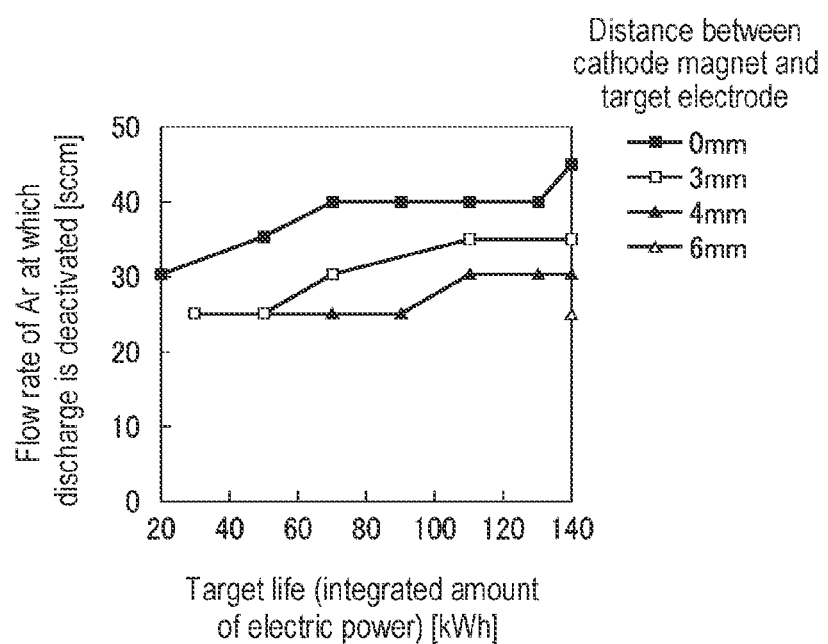
FIG. 5 is a view showing results obtained by obtaining a relationship between a target life (an accumulated of electric power) and an Ar flow rate at which discharge is deactivated, in various distances between a cathode magnet and a target electrode.

Actually, discharge stability was evaluated using $CoFe_{30}B$, which is a magnetic material, as a target material. Here, a relationship between a target life (an accumulated amount of electric power) and an Ar flow rate at which discharge is deactivated was obtained in terms of various distances between a cathode magnet and a target electrode. The results are illustrated in FIG. 5. Here, the thicknesses of the targets were 5 mm and the supply power was 500 W.

As illustrated in FIG. 5, it can be seen that, when the target life (the accumulated amount of electric power) increases and the erosion of the target progresses, the flow rate of the Ar gas at which the discharge is deactivated increases when the distance between the cathode magnet and the target electrode is the same. In addition, it can be seen that it is necessary to increase the distance between the cathode magnet and the target electrode in order to perform stable discharge under a low flow rate (low pressure) when the target life increases.

That is, in the apparatus disclosed in Patent Document 1, when the erosion of the target progresses, in order to secure the discharge stability, it is necessary to take a measure for adjusting the strength of the leakage magnetic field of the cathode magnet by, for example, changing the distance between the cathode magnet and the target electrode.

In the apparatus disclosed in Patent Document 1, the oscillation height position itself of the cathode magnet may be changed through shim adjustment or the like. However, although this makes it possible to adjust the strength of the leakage magnetic field itself, the cathode magnet only oscillates at the same height. Therefore, since it is not possible to change the shape of the target erosion, it is difficult to avoid fluctuation in film formation performance and to improve the utilization rate of the target to extend the life end of the target.

Specific examples at this time will be described with reference to FIGS. 6 and 7.

Figure 6:
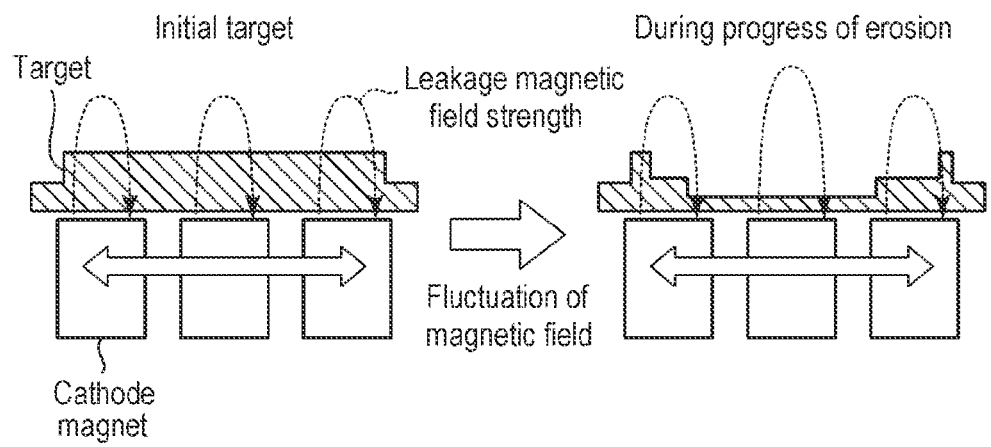
FIG. 6 is a view illustrating leakage magnetic field strengths in an initial target and a target during the progress of erosion in the apparatus of Patent Document 1 in which the cathode magnet is oscillated.

In the apparatus of Patent Document 1 in which a cathode magnet is oscillated, as illustrated in FIG. 6, in an initial target in which erosion has not progressed, a uniform magnetic field strength is imparted to the target by oscillating a leakage magnetic field. However, as the erosion progresses, for example, a steep erosion shape in which erosion is great in the center of the target is formed based on the magnetic circuit of the cathode magnet. Therefore, the target life is shortened, and the leakage magnetic field strength is locally increased, which induces ignition instability.

Figure 7:
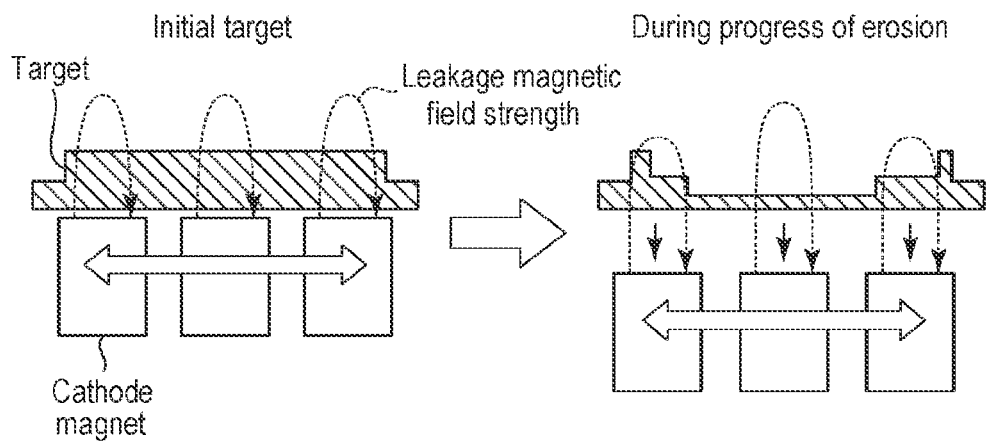
FIG. 7 is a view illustrating leakage magnetic field strengths in an initial target and a target during the progress of erosion in a case in which an oscillation height position of the cathode magnet is changed in the apparatus of Patent Document 1 in which the cathode magnet is oscillated.

As illustrated in FIG. 7, it is possible to adjust the leakage magnetic field strength itself during the progress of erosion by changing the oscillation height position of the cathode magnet by shim adjustment or the like. However, when the height at which the cathode magnet is oscillated is the same and only the leakage magnetic field strength changes as a whole, the steep erosion shape does not change significantly.

In contrast, in the present embodiment, the cathode magnet 35 may be oscillated in the X direction along the main surface of the target 31 by the oscillating driver 70 of the magnet driving part 36, and independently of this, the cathode magnet 35 may move in the Z direction, which is perpendicular to the main surface of the target. Therefore, the cathode magnet 35 can be arbitrarily three-dimensionally scanned. Therefore, when the cathode magnet 35 is oscillated in the X direction by the oscillation driver 70 of the magnet driving part 36, it is possible to control the leakage magnetic field strength directly above the target 31 by moving the cathode magnet 35 in the Z direction by the perpendicular driver 80.

Figure 8:
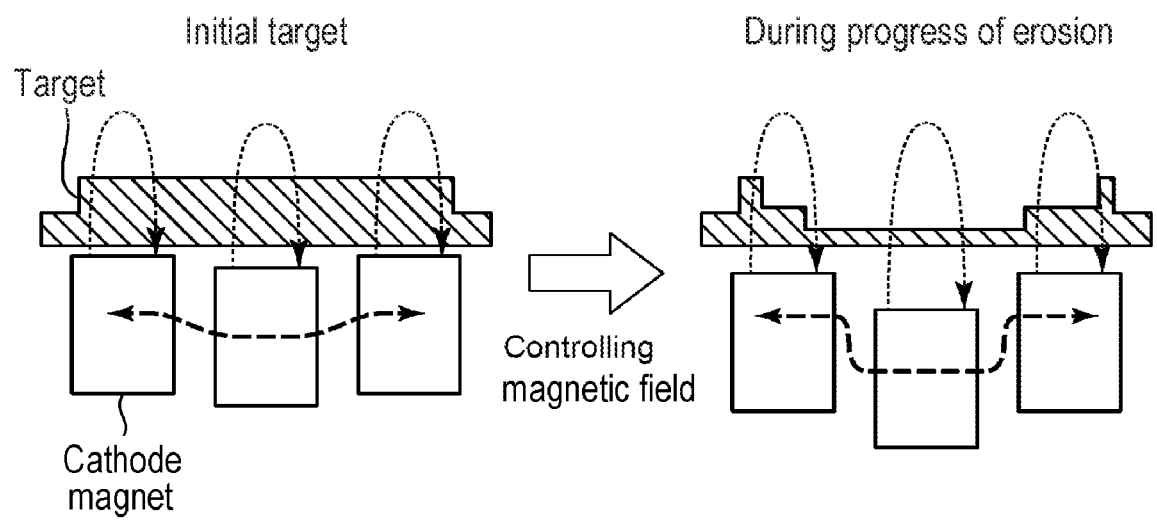
FIG. 8 is a view illustrating leakage magnetic field strengths in an initial target and a target during the progress of erosion in the apparatus of the first embodiment.

Specifically, as illustrated in FIG. 8, the cathode magnet 35 is controlled by the perpendicular driver 80 such that, in the portion of the target 31 in which erosion is large (the center), the cathode magnet 35 is moved away from the target 31 and in the portion in which the erosion is small (the end portions), the cathode magnet 35 is brought close to the target 31.

The following (1) and (2) are exemplified as the driving control of the cathode magnet 35 at this time.

(1) The erosion pattern of a target 31 is analyzed in advance, the leakage magnetic field strength according to the target shape at that time is obtained through simulation, and the perpendicular driver 80 is controlled using the data.

In this case, the leakage magnetic field strength data according to the target shape obtained through the simulation is stored in the magnet data storage part 91, and the magnet driving controller 92 controls the perpendicular driver 80 based on the data.

(2) A discharge parameter such as a discharge voltage is monitored in real time, and the perpendicular driver 80 is controlled such that the discharge parameter is maintained in a constant manner. In this case, the discharge parameter is monitored in real time by the sensor 93, and the perpendicular driver 80 is feedback-controlled by the magnet driving controller 92 based on the detection of the sensor 93.

As described above, by controlling the leakage magnetic field strength directly above the target 31 by controlling the perpendicular driver 80 of the magnet driving part 36, it is possible to improve the uniformity of the erosion shape on the entire surface of the target. Therefore, it is possible to ensure the discharge stability and the stability of the film forming speed and the film forming distribution. In addition, since the target erosion uniformly progresses, the target utilization rate is improved so that the target life end can be extended, which makes it possible to increase the number of sheets that can be produced by one target to increase the productivity.

Next, the control when the magnet driving part 36 is oscillated along the longitudinal direction (the X direction) of the target 31 will be described. By controlling the position of the cathode magnet 35 in the X direction at the time of plasma ignition in the magnet driving part 36, it is possible to further improve the discharge stability and the utilization rate of the target.

Figure 9:
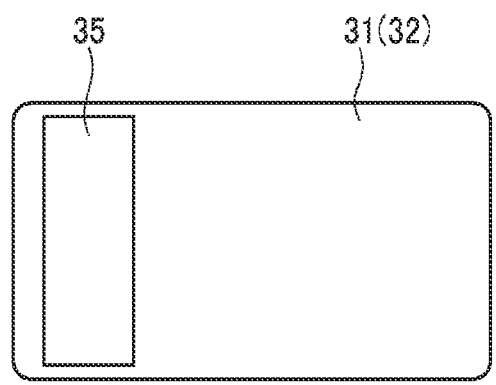
FIG. 9 is a schematic plan view showing a position of a cathode magnet in an X direction at the time of conventional plasma ignition.

When oscillating the cathode magnet 35 in the X direction, conventionally, it is common to always set the initial position of the cathode magnet 35 to one end of the target 31 (the target electrode 32), for example, the left end as illustrated in FIG. 9, and the plasma is ignited in the state in which the cathode magnet 35 is located at the initial position thereof.

However, it was found that the end of the target is not suitable as the position of the cathode magnet at the time of plasma ignition. It is considered that this is because the leakage magnetic field strength from the cathode magnet is smaller at the end of the target than that in the erosion portion in the center of the target because there is a non-erosion portion at the end of the target and there is an influence of peripheral components.

Figure 10:
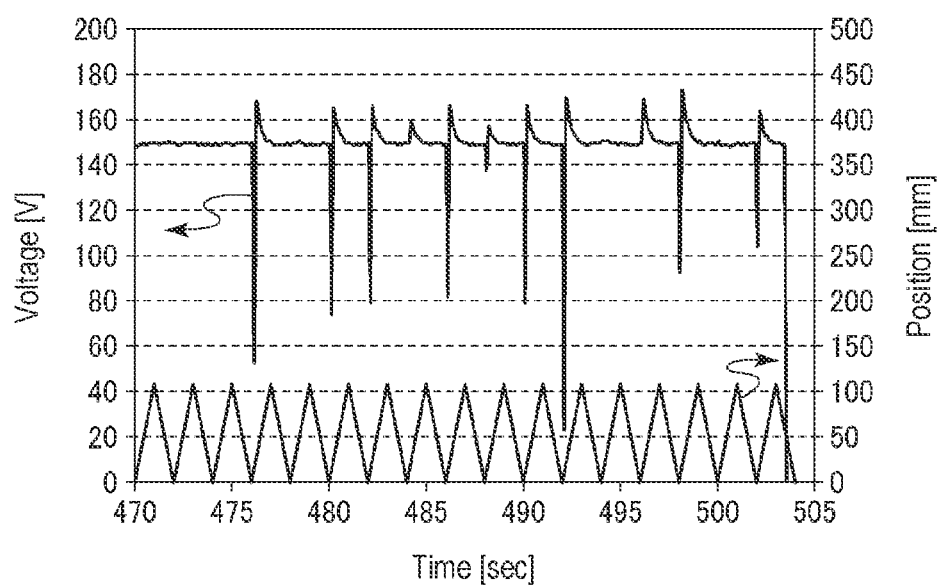
FIG. 10 is a view illustrating a relationship between a discharge voltage and a position of a cathode magnet in the X direction.

FIG. 10 is a view illustrating a relationship between a discharge voltage and a position of a cathode magnet in the X direction. The cathode magnet position is 0 mm at the left end, 50 mm at the center, and 100 mm at the right end. As shown in this figure, when the cathode magnet 35 is located at the left end, a sharp drop in the discharge voltage appears. This decrease in discharge voltage indicates that the plasma is misfired or is on the verge of misfire. This indicates that the presence of the cathode magnet 35 at the end of the target is disadvantageous for plasma ignition.

Figure 11:
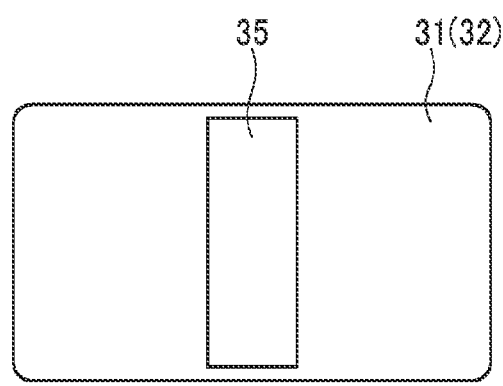
FIG. 11 is a schematic plan view illustrating a position of a cathode magnet in the X direction at the time of plasma ignition in the first embodiment.

Therefore, it is preferable to control the oscillation driver 70 of the magnet driving part 36 such that the position of the cathode magnet 35 in the X direction at the time of plasma ignition is the center of the target 31 in the X direction as illustrated in FIG. 11. In particular, in an application in which flatness and film quality of a film are required, it is effective to control the position of the cathode magnet in the X direction in this way since plasma ignition is difficult when low-pressure sputtering is performed under an ultra-high vacuum (0.02 Pa or less).

Next, the verification results of this will be described.

FIGS. 12A and 12B are views showing ignition states when the positions of the magnets at the time of plasma ignition were the left end and the center, in which FIG. 12A is the case in which the flow rate of the Ar gas was set to 200 sccm, and FIG. 12B is the case of a low flow rate (low pressure) in which the flow rate of the Ar gas was set to 11.5 sccm. In the figures, ○ indicates a case of normal ignition, and R indicates a case of ignition retry. As shown in FIG. 12A, when the flow rate of the Ar gas was 200 sccm, ignition was normally performed regardless of the position of the cathode magnet. As shown in FIG. 12B, when the flow rate of the Ar gas was as low as 11.5 sccm (low pressure), ignition was retried at the left end of the cathode magnet, and ignition was unstable, whereas ignition was stable when the cathode magnet was located in the center.

Figure 13:
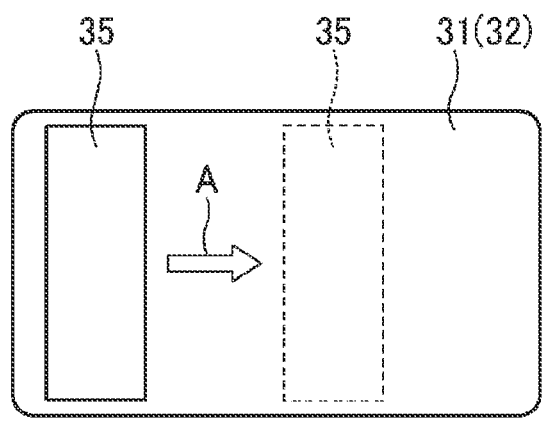
FIG. 13 is a view illustrating a direction in which a cathode magnet moves after ignition when the position of the cathode magnet in the X direction at the time of plasma ignition is one end of a target.

In addition, when the position of the cathode magnet 35 in the X direction at the time of plasma ignition is one end of the target as in the conventional case, as illustrated in FIG. 13, the direction in which the cathode magnet 35 moves after ignition is limited to the same direction (direction A). Therefore, the left erosion and the right erosion of the target tend to be non-uniform depending on the discharge time (deposition time). This may lower the utilization rate of the target.

Figure 14:
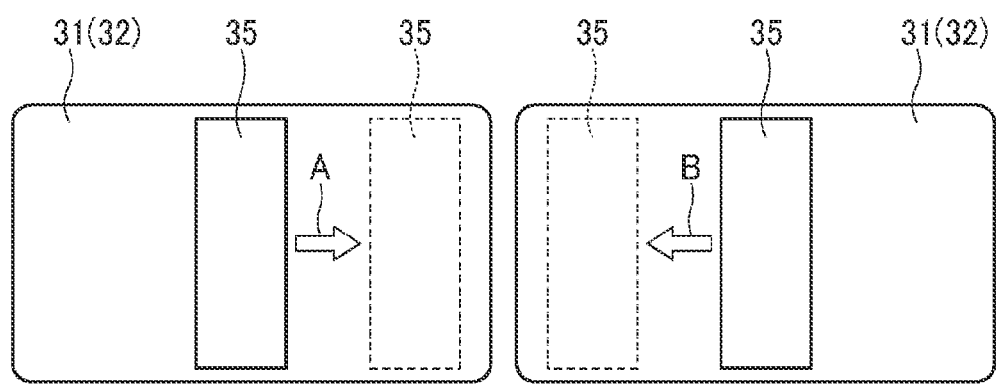
FIG. 14 is a view illustrating a direction in which the cathode magnet moves after ignition when the position of the cathode magnet in the X direction at the time of plasma ignition is the center of the target.

In this regard, after the position of the cathode magnet 35 in the X direction at the time of plasma ignition is set to the center of the target as described above, it is preferable to control the oscillation driver 70 of the magnet driving part 36 to alternately change the direction in which the cathode magnet 35 moves after ignition such that, for one substrate, the direction is one direction (direction A) and, for the next substrate, the direction is the opposite direction (direction B), as illustrated in FIG. 14. The oscillation driver 70 may be controlled to alternately change the direction in which the cathode moves from lot to lot such that, for a substrate of one lot, the direction is one direction (direction A) and, for a substrate of the next lot, the direction is the opposite direction (direction B). Furthermore, it may be controlled to change the direction for each of several substrates. This makes the erosion of targets 31 more uniform so that the utilization rate of the targets can be increased.

Second Embodiment

Next, a second embodiment will be described.

Figure 15:
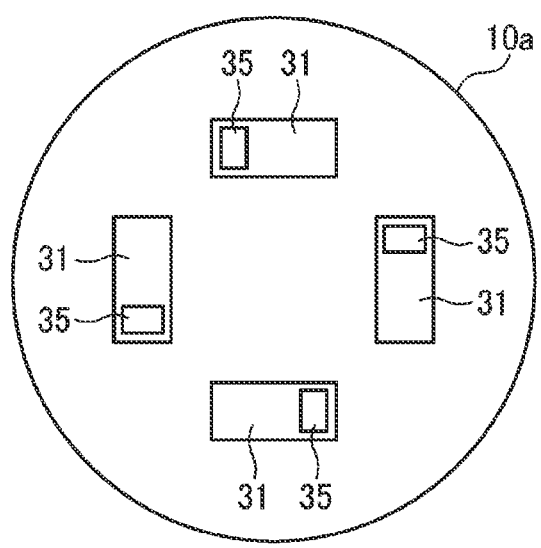
FIG. 15 is a schematic plan view of a film forming apparatus according to a second embodiment.
Figure 16:
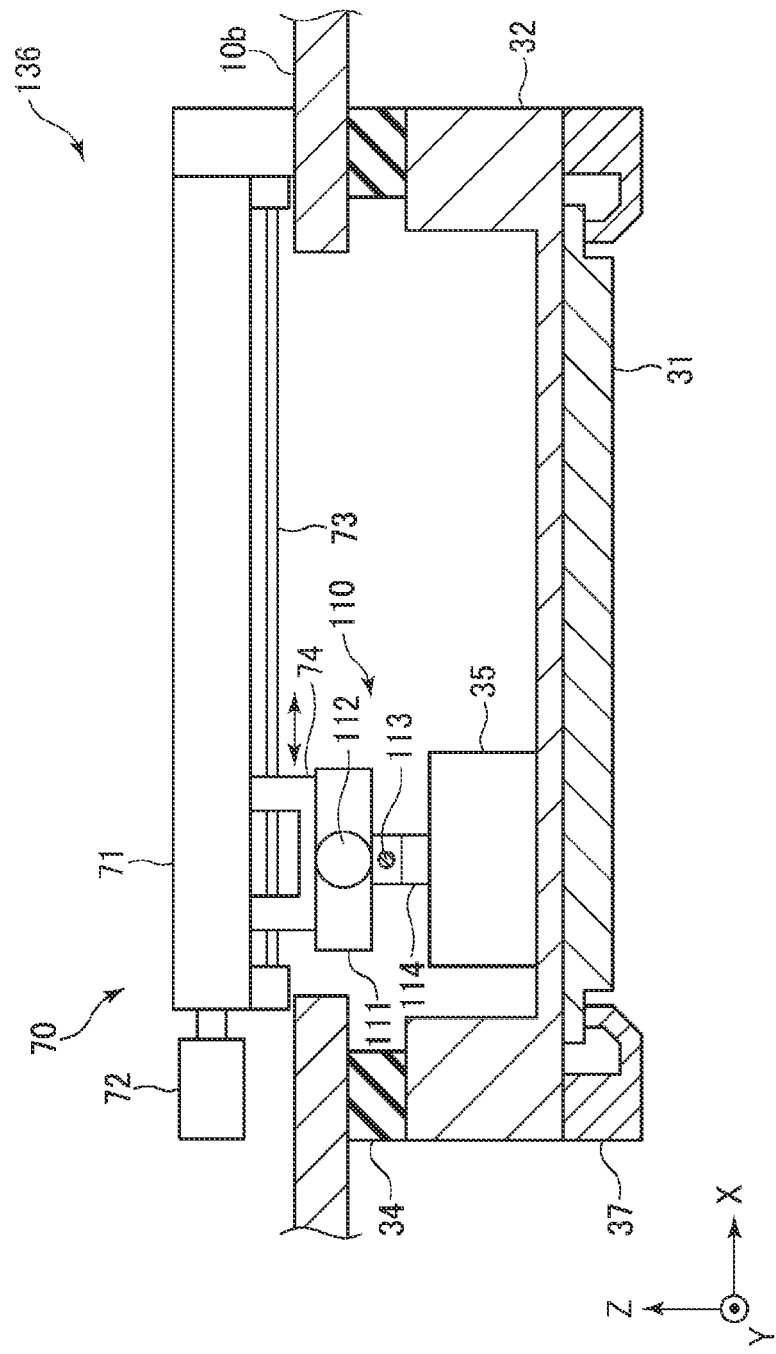
FIG. 16 is a cross-sectional view for explaining in detail a magnet driving part of the film forming apparatus according to the second embodiment.

FIG. 15 is a schematic plan view of a film forming apparatus according to the second embodiment, and FIG. 16 is a cross-sectional view for explaining in detail a magnet driving part of the film forming apparatus according to the second embodiment.

The basic configuration of the film forming apparatus according to the second embodiment is substantially the same as that of the film forming apparatus according to the first embodiment, but differs from the first embodiment in that a magnet driving part 136 is used instead of the magnet driving part 36 of the first embodiment.

As illustrated in FIG. 15, in the present embodiment, the length of the cathode magnet 35 is shorter than the short side of the target 31, and thus the cathode magnet 35 is movable not only in the long-side direction of the target, but also in the short-side direction.

The magnet driving part 136 of the present embodiment is configured such that the cathode magnet 35 is movable in a plane along the long-side direction and the short-side direction of the target 31. Specifically, as illustrated in FIG. 16, the magnet driving part 136 of the present embodiment includes an oscillation driver 70 configured to oscillate the cathode magnet 35 similar to that of the first embodiment along the long-side direction (the X direction) of the target 31. The magnet driving part 136 also includes a short-side direction driver 110 configured to drive the cathode magnet 35 along the short-side direction (the Y direction) of the target 31. The magnet driving part 136 does not include the perpendicular driver 80 provided in the magnet driving part 36 of the first embodiment.

The short-side direction driver 110 includes a Y-direction ball screw mechanism 111 incorporating therein a Y-direction ball screw (not illustrated) extending in the Y direction, a motor 112 configured to rotate the Y-direction ball screw, and a guide member 113 extending along the Y-direction ball screw mechanism 111. The Y-direction ball screw mechanism 111 is supported by the X-direction moving member 74 of the oscillation driver 70. The short-side direction driver 110 further includes a Y-direction moving member 114 threadedly coupled to the Y-direction ball screw and guided by the guide member 113 to move in the Y direction. The cathode magnet 35 is supported by the Y-direction moving member 114. When the Y-direction ball screw of the Y-direction ball screw mechanism 111 is rotated by the motor 112, the cathode magnet 35 is driven in the Y direction along the guide member 113 together with the Y-direction moving member 114. Therefore, the oscillation driver 70 and the short-side direction driver 110 make it possible to freely move the cathode magnet 35 in the XY plane of the target 31.

The driving mechanisms of the oscillation driver 70 and the short-side direction driver 110 are not limited to the above-described ball screw mechanisms. Other driving mechanisms may be used as long as the oscillation driver 70 has a configuration that includes a first moving part extending in the X direction and configured to move the cathode magnet 35 in the X direction and the short-side direction driver 110 has a configuration that includes a second moving part configured to move the cathode magnet 35 in the Y direction. In the case of the ball screw mechanism, the X-direction ball screw mechanism 71 constitutes the first moving part, and the Y-direction ball screw mechanism 111 constitutes the second moving part.

In the present embodiment, as in the first embodiment, a film forming process is also initiated in the state in which the interior of the processing container 10 is controlled to a predetermined pressure, a to-be-unused target 31 is shielded by the shutter 50, and an opening 51 is made to correspond to a to-be-used target 31. In the film forming process, an inert gas such as an Ar gas is introduced into the processing container 10, and then a voltage is applied from the power supply 33 to the target 31 via the target electrode 32 to excite the Ar gas. At this time, since the leakage magnetic field of the cathode magnet 35 is applied to the periphery of the target, plasma is concentrated around the target 31 to form magnetron plasma, and sputtered particles are deposited on the substrate W by magnetron sputtering.

Figure 17:
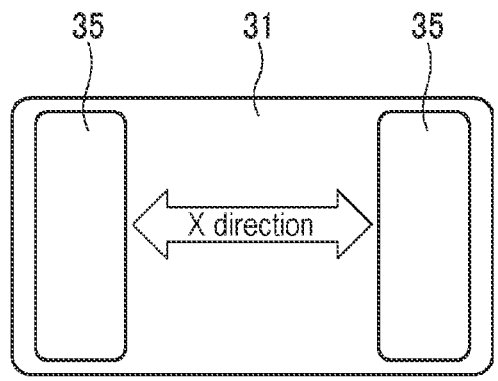
FIG. 17 is a view for explaining a movement of a cathode magnet by a magnet driving part of a conventional film forming apparatus.
Figure 18:
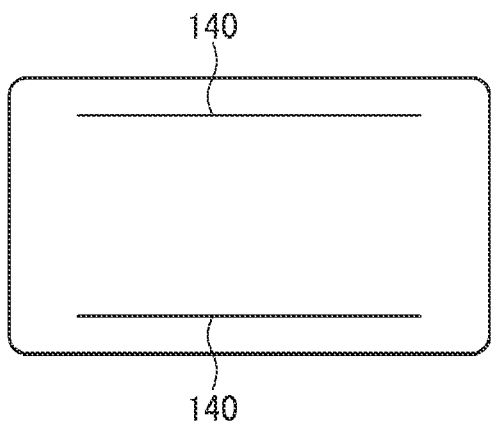
FIG. 18 is a view for explaining an erosion state of the target when the cathode magnet is moved in the magnet driving part of FIG. 17.

As described above, deep and steep erosion is formed based on a magnetic circuit of the cathode magnet only with the oscillation of the cathode magnet as in Patent Document 1. That is, since the leakage magnetic field becomes large at the ends of the cathode magnet 35, erosion due to the leakage magnetic field becomes more intense at the ends of the cathode magnet 35. Therefore, as illustrated in FIG. 17, when the cathode magnet 35 is oscillated only in the longitudinal direction of the target 31, steep erosion regions 140 where erosion is intense occur in portions along the movement traces of the ends of the oscillating cathode magnet as illustrated in FIG. 18. At this time, there are only two erosion regions 140, and when only the erosion regions 140 are eroded one after another, the target life will be shortened. In addition, since the locally steep erosion regions are generated, the utilization rate of the target is also lowered.

Therefore, in the present embodiment, the magnet driving part 136 is configured to allow the cathode magnet 35 to move not only in the long-side direction (the X direction) but also in the short-side direction (the Y direction) of the target 31 so that in the rear surface of the target 31, the cathode magnet 35 is freely movable on the XY plane. Specifically, the oscillation driver 70 of the magnet driving part 136 is configured to oscillate the cathode magnet 35 in the long-side direction and to move the cathode magnet 35 in the short-side direction by the short-side direction driver 110.

As a result, since it is possible to expand the regions in which steep erosion is formed in the target 31, it is possible to suppress the local progress of erosion. Therefore, it is possible to extend the target life, so that it is also possible to increase the utilization rate of the target 31.

Figure 19:
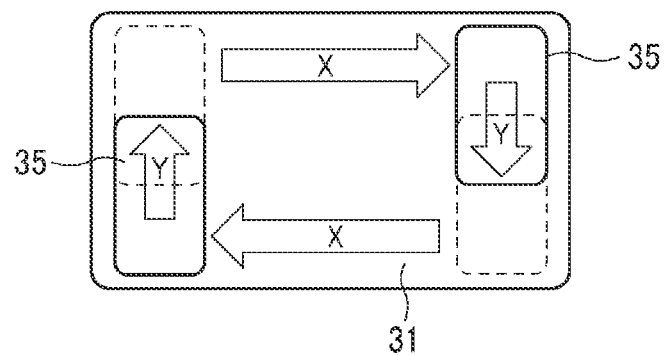
FIG. 19 is a schematic view illustrating an example of a specific scanning mode of the cathode magnet in the second embodiment.
Figure 20:
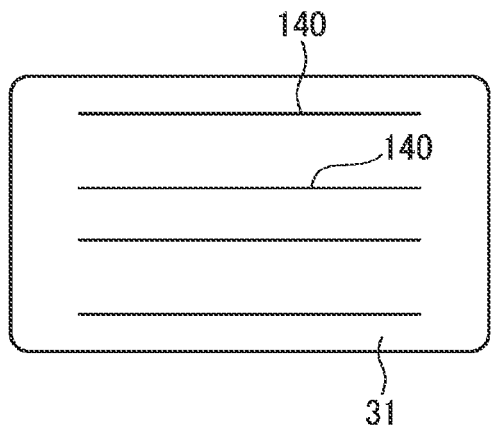
FIG. 20 is a view for explaining the erosion state of a target when the cathode magnet is scanned as illustrated in FIG. 19.

As a specific scanning mode of the cathode magnet 35 at this time, for example, as illustrated in FIG. 19, there may be an aspect in which the cathode magnet 35 is oscillated in the X direction in the state in which the position of the cathode magnet 35 in the Y direction is located at an arbitrary position. In this case, as illustrated in FIG. 20, four steep erosion regions 140 are formed in parallel to each other, and thus the erosion regions 140 can be expanded.

Figure 21:
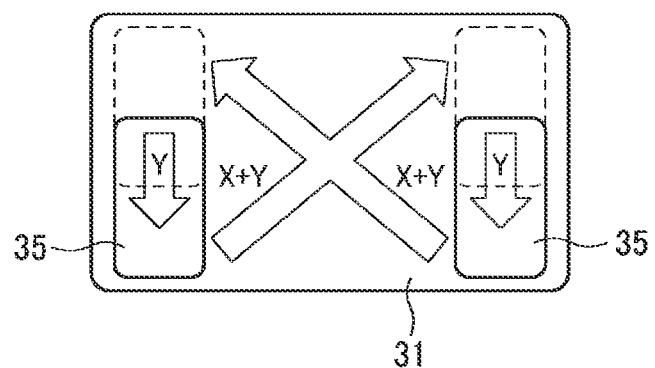
FIG. 21 is a schematic view illustrating another example of the specific scanning mode of the cathode magnet in the second embodiment.
Figure 22:
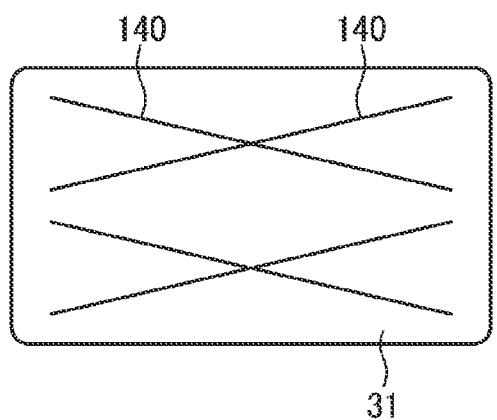
FIG. 22 is a view for explaining an erosion state of a target when the cathode magnet is scanned as illustrated in FIG. 21.

In addition, as illustrated in FIG. 21, there may be an aspect in which the oscillation driver 70 and the short-side direction driver 110 are simultaneously driven to scan the cathode magnet 35 in an arbitrary trace, for example, in the form of figure-of-eight in the XY plane. In this case, as illustrated in FIG. 22, a total of four steep erosion regions 140 are formed to intersect each other at two locations, and thus the erosion regions 140 can be expanded in the same manner.

Third Embodiment

Next, a third embodiment will be described.

Figure 23:
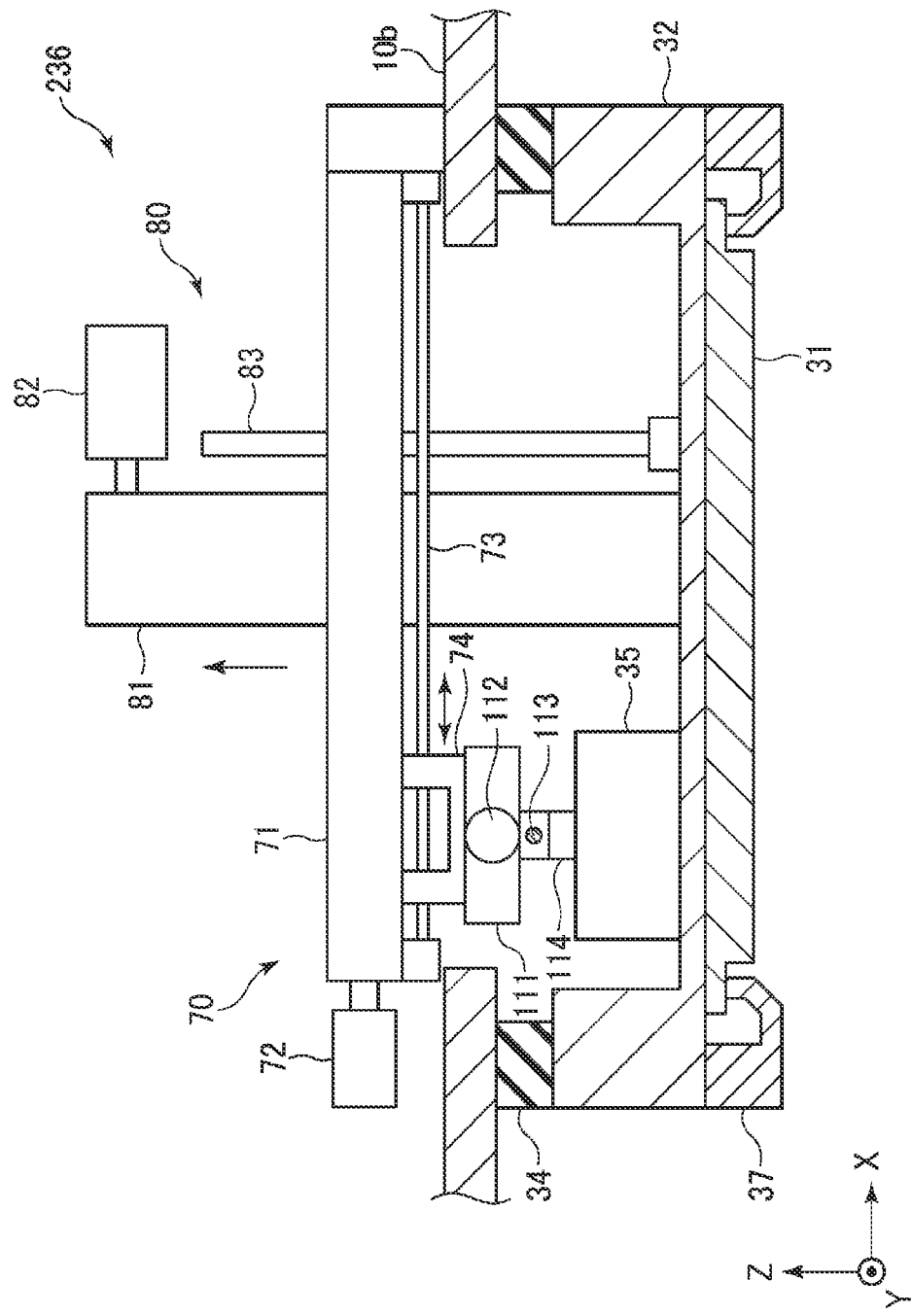
FIG. 23 is a cross-sectional view for explaining in detail a magnet driving part of the film forming apparatus according to a third embodiment.

FIG. 23 is a cross-sectional view for explaining in detail a magnet driving part of the film forming apparatus according to the third embodiment.

The basic configuration of the film forming apparatus according to the third embodiment is almost the same as that of the film forming apparatus according to the first embodiment and the second embodiment, but is different in the configuration of the magnet driving part.

In addition, in the present embodiment, as in the second embodiment, the length of the cathode magnet 35 is shorter than the short side of the target 31, and thus the cathode magnet 35 is configured to be movable not only in the long-side direction of the target but also in the short-side direction (see FIG. 15).

The magnet driving part 236 of the present embodiment is configured to be capable of moving the cathode magnet 35 in a plane along the long-side direction and the short-side direction of the target 31, and also capable of moving the cathode magnet 35 in a direction perpendicular to the plane of the target 31. Specifically, as illustrated in FIG. 23, the magnet driving part 236 of the present embodiment includes an oscillation driver 70, a perpendicular driver 80, and a short-side direction driver 110. The configurations of the oscillation driver 70 and the short-side direction driver 110 are the same as those of the second embodiment. In addition, the configuration of the perpendicular driver 80 is the same as that of the first embodiment.

The driving mechanisms of the oscillation driver 70, the short-side direction driver 110, and the perpendicular driver 80 are not limited to the above-described ball screw mechanisms. The oscillation driver 70, the short-side direction driver 110, and the perpendicular driver 80 only need to include a first driver configured to move the cathode magnet 35 in the X direction, a second driver configured to move the cathode magnet 35 in the Y direction, and a third driver configured to move the cathode magnet 35 in the Z direction, respectively. In the case of the above-described ball screw mechanisms, the X-direction ball screw mechanism 71 constitutes the first moving part, the Y-direction ball screw mechanism 111 constitutes the second moving part, and the Z-direction ball screw mechanism 81 constitutes the third moving part.

In the present embodiment, as in the first and second embodiments, a film forming process is also initiated in the state in which the interior of the processing container 10 is controlled to a predetermined pressure, a to-be-unused target 31 is shielded by the shutter 50, and an opening 51 is made to correspond to a to-be-used target 31. In the film forming process, an inert gas such as an Ar gas is introduced into the processing container 10, and then a voltage is applied from the power supply 33 to the target 31 via the target electrode 32 to excite the Ar gas. At this time, since the leakage magnetic field of the cathode magnet 35 is applied to the periphery of the target, plasma is concentrated around the target 31 to form magnetron plasma, and sputtered particles are deposited on the substrate W by magnetron sputtering.

In the present embodiment, the magnet driving part 236 is configured to be capable of moving the cathode magnet 35 in the long-side direction and the short-side direction of the target 31, and also capable of moving the cathode magnet 35 in a direction perpendicular to the plane of the target 31. That is, the magnet driving part 236 is configured such that the oscillation driver 70 oscillates the cathode magnet 35 in the long-side direction (the X direction), and the short-side direction driver 110 moves the cathode magnet 35 in the short-side direction (the Y direction), and the perpendicular driver 80 moves the cathode magnet 35 in the perpendicular direction (Z direction).

In this way, in addition to being movable in the X and Y directions, the cathode magnet 35 is also movable in the Z direction, which is the perpendicular direction, whereby the region in which erosion is formed in the target 31 can be expanded and the erosion width can be expanded. That is, since the cathode magnet 35 moves in the XY plane, the erosion region in which the leakage magnetic field is strong is expanded in the target 31, and since the cathode magnet 35 moves in the Z direction, it is possible to weaken the leakage magnetic field strength to make the depth of erosion shallow and to increase the width of erosion. Therefore, the effect of prolonging the target life and the effect of increasing the utilization rate of the target 31 can be further enhanced compared with the second embodiment.

Figure 24:
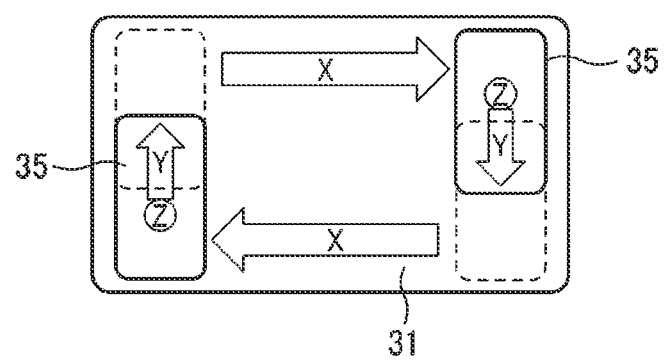
FIG. 24 is a schematic view illustrating an example of a specific scanning mode of a cathode magnet in the third embodiment.
Figure 25:
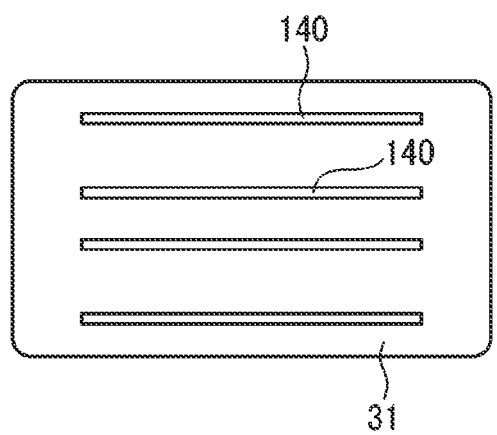
FIG. 25 is a view for explaining an erosion state of a target when the cathode magnet is scanned as illustrated in FIG. 24.

For example, as illustrated in FIG. 24, there may be an aspect in which, as in FIG. 19, in addition to oscillating the cathode magnet 35 in the X direction in the state in which the cathode magnet 35 is located at an arbitrary position in the Y direction, the position of the cathode magnet 35 in the Z direction is adjusted. In this case, as illustrated in FIG. 25, four erosion regions 140 are formed in parallel to each other. Thus, it is possible to widen the erosion regions 140 and to make the erosion regions 140 shallow and wide. Of course, as in FIG. 21, in addition to scanning the cathode magnet 35 in an arbitrary trace in the XY plane, for example, in the form of figure-of-eight, the position of the cathode magnet 35 in the Z direction may be adjusted. In that case, the same effect can also be obtained.

Other Applications

Although embodiments have been described above, it should be considered that the embodiments disclosed herein are exemplary in all respects and are not restrictive. The embodiments described above may be omitted, replaced, or modified in various forms without departing from the scope and spirit of the appended claims.

For example, the overall configuration of the film forming apparatus is not limited to those described in the embodiments, the positions, angles, and sizes of the targets are optional, and the number of magnets arranged in one target is also optional. Furthermore, the elements of the first to third embodiments may be combined as appropriate.

EXPLANATION OF REFERENCE NUMERALS

1: film forming apparatus, 10: processing container, 10a: container main body, 10b: lid, 20: substrate holder, 30: cathode unit, 31: target, 32: target electrode, 33: power supply, 35: cathode magnet, 36, 136, 236: magnet driving part, 40: gas supplier, 50: shutter, 60: controller, 70: oscillation driver, 80: perpendicular driver, 91: magnet data storage part, 92: magnet driving controller, 93: sensor, 110: short-side direction driver, W: substrate

What is claimed is:
1. A film forming apparatus comprising:
a processing container;
a substrate holder configured to hold a substrate inside the processing container;
a cathode unit disposed above the substrate holder, and including:
a target configured to emit sputtered particles to the substrate;
a power supply configured to supply electric power to the target;
a magnet provided on a rear side of the target, and configured to apply a leakage magnetic field to the target; and
a magnet driving part configured to drive the magnet;
a gas introducing mechanism configured to introduce a plasma generating gas into the processing container; and
a controller including a magnet data storage part and a magnet driving controller, and configured to control the magnet driving part,
wherein the magnet driving part comprises:
an oscillation driver configured to oscillate the magnet along the target; and
a perpendicular driver configured to drive the magnet in a direction perpendicular to a main surface of the target independently of driving performed by the oscillation driver,
wherein magnetron plasma is formed near the target, and the sputtered particles are deposited on the substrate by magnetron sputtering,
wherein the controller controls the driving of the magnet performed by the perpendicular driver of the magnet driving part such that a leakage magnetic field strength exerted from the magnet to the target becomes appropriate when the magnet is being oscillated, and wherein the leakage magnetic field strength of the magnet according to a target shape based on the erosion of the target is stored in the magnet data storage part, and the driving of the magnet performed by the perpendicular driver of the magnet driving part is controlled by the magnet driving controller based on data stored in the magnet data storage part.

2. The film forming apparatus of claim 1, wherein the target has a rectangular shape.

3. The film forming apparatus of claim 2, wherein the oscillation driver is further configured to oscillate the magnet in a longitudinal direction of the target.

4. The film forming apparatus of claim 1, wherein the oscillation driver includes a first moving part extending in an oscillation direction of the magnet and configured to move the magnet in the oscillation direction, and the perpendicular driver includes a second moving part configured to move the first moving part in a direction perpendicular to the main surface of the target.

5. The film forming apparatus of claim 4, wherein the oscillation driver comprises:
a first ball screw mechanism used as the first moving part and having a first ball screw extending in the oscillation direction,
a first moving member threadedly coupled to the first ball screw to move in the oscillation direction,
a first motor configured to rotate the first ball screw, and
a first guide configured to guide the first moving member in the oscillation direction,
wherein the perpendicular driver comprises:
a second ball screw mechanism used as the second moving part and having a second ball screw extending in the direction perpendicular to the main surface of the target,
a second moving member threadedly coupled to the second ball screw to move in the direction perpendicular to the main surface of the target,
a second motor configured to rotate the second ball screw, and
a second guide configured to guide the second moving member in the direction perpendicular to the main surface of the target, and
wherein the first ball screw mechanism is supported by the second moving member, and the magnet is supported by the first moving member.

6. The film forming apparatus of claim 1, wherein the controller is further configured to control the driving of the magnet performed by the perpendicular driver of the magnet driving part such that, in a portion in which erosion of the target is large, the magnet is moved away from the target and, in a portion in which the erosion of the target is small, the magnet is brought closer to the target.

7. The film forming apparatus of claim 1, wherein the controller includes a sensor configured to detect a discharge parameter and a magnet driving controller, wherein the discharge parameter is monitored by the sensor, and the driving of the magnet performed by the perpendicular driver of the magnet driving part is controlled by the magnet driving controller such that the discharge parameter is maintained constant.

8. The film forming apparatus of claim 1,
wherein the controller controls the oscillation driver of the magnet driving part such that a position of the magnet in a direction along the target at a time of ignition of the magnetron plasma is a center of the target.

9. The film forming apparatus of claim 8, wherein the controller controls the oscillation driver of the magnet driving part to alternately change a direction in which the magnet moves along the target after the ignition of the magnetron plasma on a substrate basis or on a lot basis such that, for one substrate, the direction is a first direction and, for a next substrate, the direction is a second direction opposite to the first direction, or for a substrate of one lot, the direction is the first direction, and for a substrate of a next lot, the direction is the second direction.

10. A film forming apparatus comprising:
a processing container;
a substrate holder configured to hold a substrate inside the processing container;
a cathode unit disposed above the substrate holder, and including:
a target configured to emit sputtered particles to the substrate;
a power supply configured to supply electric power to the target;
a magnet provided on a rear side of the target, and configured to apply a leakage magnetic field to the target; and
a magnet driving part configured to drive the magnet; and
a gas introducing mechanism configured to introduce a plasma generating gas into the processing container,
wherein the magnet driving part is configured to move the magnet along a long side direction and a short side direction of the target,
wherein magnetron plasma is formed near the target, and the sputtered particles are deposited on the substrate by magnetron sputtering,
wherein the magnet driving part includes:
an oscillation driver configured to oscillate the magnet along the long-side direction of the target; and
a short-side direction driver configured to move the magnet along the short-side direction of the target,
wherein the oscillation driver includes:
a first moving part extending in an oscillation direction of the magnet and configured to move the magnet in the oscillation direction;
a first ball screw mechanism used as the first moving part and having a first ball screw extending in the oscillation direction;
a first moving member threadedly coupled to the first ball screw to move in the oscillation direction;
a first motor configured to rotate the first ball screw; and
a first guide configured to guide the first moving member in the oscillation direction,
wherein the short-side direction driver includes:
a second moving part configured to move the magnet in the short-side direction;
a second ball screw mechanism used as the second moving part and having a second ball screw extending in the short-side direction;
a second moving member threadedly coupled to the second ball screw to move in the short-side direction;
a second motor configured to rotate the second ball screw; and
a second guide configured to guide the first moving member in the short-side direction, and
wherein the second ball screw mechanism is supported by the first moving member, and the magnet is supported by the second moving member.

11. The film forming apparatus of claim 10, wherein the magnet driving part further includes a perpendicular driver configured to drive the magnet in a direction perpendicular to a main surface of the target.

12. The film forming apparatus of claim 11, wherein the perpendicular driver includes a third moving part configured to move the first moving part in the direction perpendicular to the main surface of the target.

13. The film forming apparatus of claim 12, wherein the perpendicular driver comprises:
a third ball screw mechanism used as the third moving part and having a third ball screw extending in the direction perpendicular to the main surface of the target,
a third moving member threadedly coupled to the third ball screw to move in the direction perpendicular to the main surface of the target,
a third motor configured to rotate the third ball screw, and
a third guide configured to guide the third moving member in the direction perpendicular to the main surface of the target, and
wherein the first ball screw mechanism is supported by the third moving member.

14. A film forming method comprising:
providing a film forming apparatus, wherein the film forming apparatus includes:
a processing container;
a substrate holder configured to hold a substrate inside the processing container;
a cathode unit disposed above the substrate holder, and including:
a target configured to emit sputtered particles to the substrate;
a power supply configured to supply electric power to the target;
a magnet provided on a rear side of the target, and configured to apply a leakage magnetic field to the target; and
a magnet driving part configured to drive the magnet; and
a gas introducing mechanism configured to introduce a plasma generating gas into the processing container,
wherein the magnet driving part includes:
an oscillation driver configured to oscillate the magnet along the target; and
a perpendicular driver configured to drive the magnet in a direction perpendicular to a main surface of the target independently of driving performed by the oscillation driver;
depositing the sputtered particles on the substrate by magnetron sputtering by supplying the electric power to the target while introducing the plasma generating gas into the processing container to form magnetron plasma near the target;
oscillating the magnet by the oscillation driver of the magnet driving part while the sputtered particles are being deposited; and
driving the magnet by the perpendicular driver of the magnet driving part such that a leakage magnetic field strength exerted from the magnet to the target becomes appropriate when the magnet is being oscillated, and
wherein the magnet is driven by the perpendicular driver of the magnet driving part based on data of the leakage magnetic field strength of the magnet according to a target shape based on the erosion of the target, the data being stored in advance.

15. The film forming method of claim 14, wherein the magnet is driven by the perpendicular driver of the magnet driving part such that, in a portion in which erosion of the target is large, the magnet is moved away from the target and, in a portion in which the erosion of the target is small, the magnet is brought closer to the target.

16. The film forming method of claim 14, wherein a discharge parameter is monitored, and the driving of the magnet performed by the perpendicular driver of the magnet driving part is controlled such that the discharge parameter is maintained constant.

17. The film forming method of claim 14, further comprising:
controlling the oscillation driver of the magnet driving part such that a position of the magnet in a direction along the target at a time of ignition of the magnetron plasma is a center of the target.

18. The film forming method of claim 17, further comprising:
controlling the oscillation driver of the magnet driving part to alternately change a direction in which the magnet moves along the target after the ignition of the magnetron plasma on a substrate basis or on a lot basis such that, for one substrate, the direction is a first direction and, for a next substrate, the direction is a second direction opposite to the first direction, or, for a substrate of one lot, the direction is the first direction and, for a substrate of a next lot, the second direction.

19. The film forming method of claim 18, wherein moving the magnet includes moving the magnet in the direction perpendicular to the main surface of the target in addition to moving the magnet along a long-side direction and a short-side direction of the target.

* * * * *